United States Patent [19]

Shiraishi

[11] 3,719,861

[45] March 6, 1973

[54] P-N JUNCTION DEVICE AND A METHOD OF MAKING THE SAME

[75] Inventor: Tadashi Shiraishi, Osaka, Japan

[73] Assignee: Matsushita Electric Industrial Co., Ltd., Kadoma, Osaka, Japan

[22] Filed: April 30, 1971

[21] Appl. No.: 139,149

Related U.S. Application Data

[63] Continuation of Ser. No. 832,980, June 13, 1969, abandoned.

[52] U.S. Cl....317/234 R, 317/234 UA, 317/235 AN

[51] Int. Cl. ................................................H01l 9/00

[58] Field of Search .................317/234 UA, 235 AN

[56] References Cited

UNITED STATES PATENTS

| | | | |
|---|---|---|---|
| 3,436,280 | 4/1969 | Shinoda | 148/178 |
| 3,422,322 | 1/1969 | Haisty | 317/235 |

*Primary Examiner*—Martin H. Edlow

*Attorney*—Wenderoth, Lind & Ponack

[57] ABSTRACT

A P-N junction device has a base of one type of semiconductive material and a thin layer of another type of semiconductive material thereon. Each semiconductive material has a semiconductivity type determining impurity therein, the semiconductivity type determining impurity in said thin layer being present in a concentration lower than the concentration of the semiconductivity type determining impurity in said base and said thin layer having opposite type impurity material therein partially compensating the semiconductivity type determining impurity and being present in a concentration decreasing from the surface of said thin layer.

4 Claims, 3 Drawing Figures

INVENTOR
TADASHI SHIRAISHI

BY Wenderoth, Lind & Ponack
ATTORNEYS

P-N JUNCTION DEVICE AND A METHOD OF MAKING THE SAME

This application is a continuation of my application Ser. No. 832,980 filed June 13, 1969, now abandoned.

BACKGROUND OF THE INVENTION

This invention relates to a novel P-N junction device in which the concentration of an impurity material decreases with increasing distance from the P-N junction, and which device has a high Q.

It is well-known that P-N junction devices in which the concentration of an impurity material decreases with increasing distance from a P-N junction are used for voltage variable capacitance diodes, drift transistors and drift diodes. When such devices are used at high frequencies, it is desirable to have a high Q and it is necessary to reduce the series resistance of said devices to obtain a high Q.

The alloy diffusion technique is generally employed in the manufacture of said devices, and this technique makes it possible to reduce the series resistance by reducing the width of the semi-conductor base to a very small dimension. However, excessive reduction of the width of the base causes penetration of the recrystallization layer through the semi-conductor base and a short circuit of the resultant device.

An object of the present invention is to provide a P-N junction device having a high Q.

Another object of the invention is to provide voltage variable capacitance diodes having a high Q and having a great variation in capacitance when subjected to a reverse bias voltage.

BRIEF SUMMARY OF THE INVENTION

These objects are achieved according to the present invention by providing a P-N junction device which comprises a base of one type of semiconductive material and a thin layer of another type of semiconductive material thereon, the semiconductivity type determining impurity material of said thin layer being present in a concentration lower than the concentration of the semiconductivity type determining impurity of said base and being partially compensated by an opposite type impurity material which diffuses from the surface of said thin layer.

DESCRIPTION OF THE PREFERRED EMBODIMENTS

Figure 1:
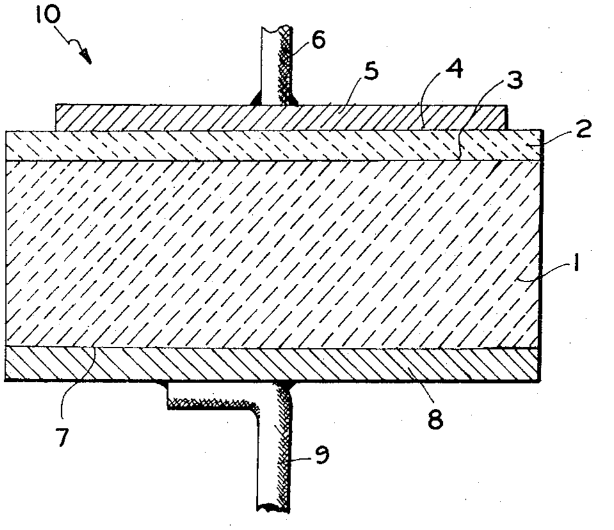

Referring to FIG. 1, reference character 10 designates, as a whole, a P-N junction device according to the present invention. The device is comprised of a base 1 made of a semiconductive material of one type of semiconductivity, for example, P-type semiconductivity. A thin layer 2 of a semiconductive material of another type of semiconductivity, for example, N-type semiconductivity, is superposed on said base with an interface 3 therebetween. The semiconductivity type determining impurity material, for example the N-type impruity material, of said thin layer 2 is present in the material of layer 2 in a concentration lower than the concentration of the P-type impurity material in the base and is partially compensated by an opposite type impurity, for example a P-type impurity material diffused from the surface 4 of said thin layer 2.

Said surface 4 has an electrode 5 thereon which is electrically connected to a lead 6 by any conventional method, such as soldering. Said base 1 is provided, on the surface 7 opposite said surface 4 on which thin layer 2 is positioned, with another electrode 8 which is electrically connected to a lead 9 by any conventional method, such as welding.

Figure 2:
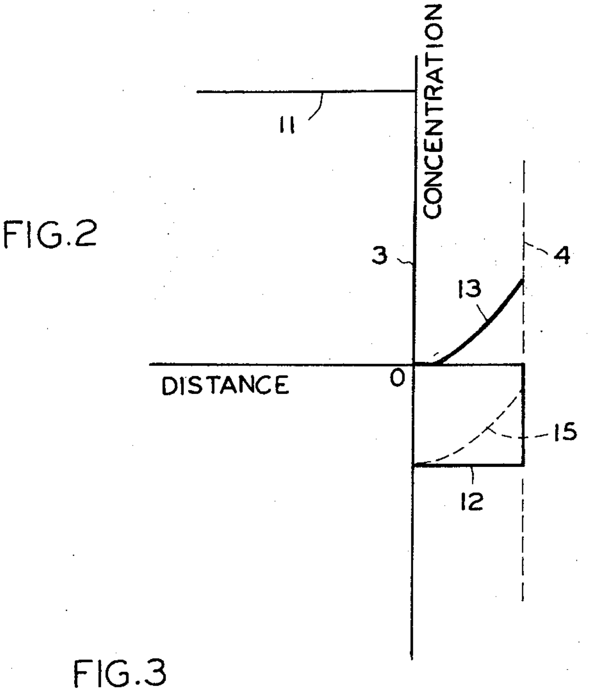

Referring to FIG. 2, reference character 4 designates a position corresponding to the aforesaid surface 4 of thin layer 2 and reference character 3 designates a position corresponding to the aforesaid interface 3 between said thin layer 2 and base 1 of FIG. 1. Values on the abscissa represent distances from said interface 3, i.e., the P-N junction; values on the upper ordinate, i.e., above the abscissa, represent concentrations of another type of impurity material, for example N-type impurity material. The concentration of impurity material in the base 1 of FIG. 1 is designated by line 11 and is higher than the concentration of the corresponding material in said thin layer 2 which concentration is represented by the line 12. For example, one or more materials taken from the group consisting of boron, aluminum, gallium and indium can be employed as an impurity material in silicon for the base 1, and one or more materials taken from the group consisting of phosphorus, arsenic and antimony can be used in epitaxial growing silicon for the thin layer 2. The curve 13 represents the concentration of an impurity material diffused into the thin layer from the surface 4. The impurity material represented by the line 13 is the same type, in this instance, P-type, as is present in the base 1, and partially compensates the impurity material, the concentration of which is represented by line 12. As a result, the effective or resulting concentration of the N-type impurity material in the thin layer 2 is represented by the curve 15. This curve 15 shows the distribution of impurity material which decreases in concentration with increasing distance from the P-N junction along line 3. For example, one or more materials taken from the group consisting of aluminum, boron, gallium and indium can be employed as the impurity material represented by the curve 13 in a thin layer composed of silicon.

The distribution of the impurity material which decreases in concentration with increasing distance from the P-N junction terminates at the said surface 4 of the thin layer 2. A conventional P-N junction device 10 having an electrode 5 connected directly to the surface 4 of an uncompensated thin layer 2 has a low series resistance and a high Q value. On the other hand, the alloy diffusion technique of diffusing a compensating impurity material into the thin layer 2 produces a P-N junction device in which a residual thick layer of semiconductive material of high resistivity is present on the outside of the thin layer 2 and the electrode is connected to this.

An illustrative embodiment of a P-N junction device according to this invention will be described with reference to FIG. 1. The base 1 is made of a P-type silicon wafer which has indium in a concentration of about $10^{19}$ atoms/$cm^3$ as a P-type impurity material and which has a resistivity of 0.02 ohm-centimeter. This base is 0.15 millimeter thick and 25 millimeters in diameter. On the base 1 is deposited a thin layer 2 of an N-type silicon having a thickness of $4\mu$ by thermal decomposition of trichlorosilane. During the deposition process, antimony is doped as an N-type impurity material in a concentration of $10^{17}$ atoms/cm$^3$. Next, aluminum atoms are diffused for 5 hours at 1,000° C into said thin layer 2 from the surface 4 by exposing the surface to a vapor of aluminum in a concentration of $8\times10^{16}$ atoms/cm$^3$ in an argon atmosphere. The thus treated silicon wafer is divided into small pieces 1 mm$^2$ by scribing. After chemical etching of the surface of the small pieces, the surface of the P-type base 7 of said pieces is provided with an aluminum electrode 8 and the surface 4 of the N-type thin layer 2 of said pieces is provided with a gold antimony electrode 5 by methods well-known in the art. Thus, one can obtain P-N junction devices, each of which has a Q value of 500 at 1 volt and a capacity of 130 pico farad at a reverse bias voltage of 0.4 volt and 7 pico farad at 10 volts. These devices can be used as voltage variable capacitance diodes with a great variation of capacitance when subjected to a reverse bias voltage at high frequency.

Figure 3:
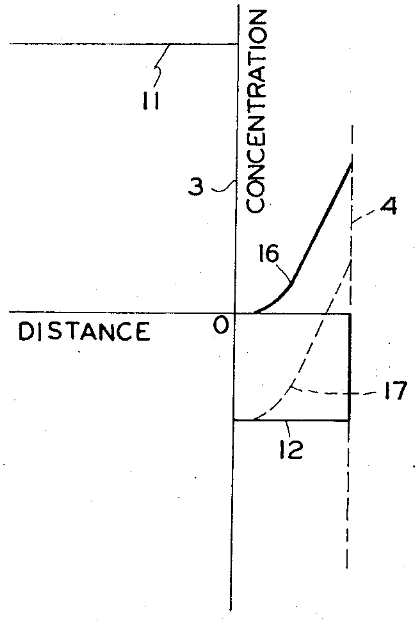

In an embodiment of the device having the concentrations of impurities as shown in FIG. 2, the concentration of, for example, the N-type impurity material represented by the line 12, is higher than that of, for example, the P-type impurity material represented by the curve 13 at the surface 4 of the thin layer 2. When the concentration 12 of N-type impurity material is lower than the concentration 16 of P-type impurity material at the surface 4, the impurity distribution in the thin layer 2 is shown by a curve 17, as shown in FIG. 3, which indicates the presence of a P-N-P junction. Such a P-N-P junction device should be construed to be within the scope of the present invention and can be easily converted into the P-N junction device having the concentrations of impurities shown in FIG. 2 by, for example, etching the surface 4 to remove a desired thickness so that the N-P junction in the P-N-P junction device can be eliminated.

While an example of the invention has been described in terms of a device which has a base of P-type semiconductivity, it will be understood that this invention can be applied equally as well to a device which has a base of N-type semiconductivity by substitution of N for P and P for N everywhere in the description.

What is claimed is:

1. A P-N junction device comprising a base of one type of semiconductive material having a first type of semiconductivity type-determining impurity therein, a separate thin layer of a second type of semiconductive material having a second type of semiconductivity type-determining impurity therein of uniform concentration throughout and attached to a surface of said base, thus forming a P-N junction between said surface and said separate thin layer, the semiconductivity type-determining impurity in said separate thin layer being present in a concentration lower than the concentration of the semiconductivity type determining impurity in said base, and said separate thin layer having therein a third impurity of a type opposite said second impurity, said third impurity being present in a concentration substantially exponentially decreasing from a maximum at the surface of said thin layer opposite the surface against said base, thereby compensating said second impurity such that its resulting effective concentration decreases substantially exponentially from a maximum at the P-N junction.

2. A P-N junction device as claimed in claim 1 wherein said base and said separate thin layer are silicon type semiconductive materials.

3. A P-N junction device as claimed in claim 2, wherein said base has P-type semiconductivity type-determining impurity therein and said separate thin layer has an N-type semiconductivity type determining impurity therein.

4. A P-N junction device as claimed in claim 3, wherein said third type impurity is aluminum.

* * * * *